United States Patent [19]

Chen et al.

[11] Patent Number: 5,300,158
[45] Date of Patent: Apr. 5, 1994

[54] PROTECTIVE COATING HAVING ADHESION IMPROVING CHARACTERISTICS

[75] Inventors: Szuchain Chen; Nina Yukov, both of Orange, Conn.

[73] Assignee: Olin Corporation, New Haven, Conn.

[21] Appl. No.: 889,036

[22] Filed: May 26, 1992

[51] Int. Cl.$^5$ .................................... C25D 7/06
[52] U.S. Cl. .................................... 148/258; 148/253
[58] Field of Search .............. 148/240, 250, 253, 258

[56] References Cited

U.S. PATENT DOCUMENTS

| | | | |
|---|---|---|---|
| 3,677,828 | 7/1972 | Caule | 148/258 |
| 3,716,427 | 2/1973 | Caule | 148/258 |
| 3,728,177 | 4/1973 | Caule | 148/258 |
| 3,728,178 | 4/1973 | Caule | 148/258 |
| 3,764,400 | 10/1973 | Caule | 148/258 |
| 3,798,074 | 3/1974 | Esler et al. | 148/258 |
| 3,833,433 | 9/1974 | Caule | 148/258 |
| 3,837,929 | 9/1974 | Caule | 148/258 |
| 3,853,691 | 12/1974 | Caule | 148/258 |
| 3,940,303 | 2/1976 | Caule | 148/258 |
| 3,941,627 | 3/1976 | Caule | 148/258 |
| 3,941,628 | 3/1976 | Caule | 148/258 |
| 3,944,449 | 3/1976 | Caule | 148/258 |
| 4,452,650 | 6/1984 | Caule | 148/258 |
| 4,582,556 | 4/1986 | Butt et al. | 156/325 |
| 4,647,315 | 3/1987 | Parthasarathi et al. | 148/258 |
| 4,939,316 | 7/1990 | Mahulikar et al. | 148/258 |
| 4,961,828 | 10/1990 | Lin et al. | 204/27 |
| 5,022,968 | 6/1991 | Lin et al. | 148/258 |
| 5,057,193 | 10/1991 | Lin et al. | 204/27 |
| 5,071,520 | 12/1991 | Lin et al. | 204/27 |

*Primary Examiner*—Scott Kastler
*Attorney, Agent, or Firm*—Gregory S. Rosenblatt

[57] ABSTRACT

There is provided a method of treating a copper or copper alloy substrate to provide improved resistance to both oxidation and to chemical attack. The substrate is immersed in an aqueous solution containing both chromium (VI) ion and phosphate ions. The treatment is particularly effective for protecting imaged printed circuit boards during storage, handling and use.

14 Claims, 2 Drawing Sheets

PROTECTIVE COATING HAVING ADHESION IMPROVING CHARACTERISTICS

BACKGROUND OF THE INVENTION

The present invention broadly relates to a method for treating a copper or copper alloy substrate to improve resistance to both oxidation and chemicals. More particularly, the substrate is immersed in an aqueous solution containing chromium (VI) ions and phosphate ions.

Copper and copper based alloys are widely used in electrical and electronic applications. Among the more widespread electronic uses are the manufacture of leadframes from strip and the manufacture of conductive circuit traces from foil. The foil is either wrought, produced by mechanically reducing the thickness of a strip such as by rolling, or electrodeposited, produced by electrolytically depositing copper ions on a rotating cathode drum and then removing the deposition from the drum. The foil is bonded to a dielectric support layer which is either rigid such as FR-4 (a flame retardant epoxy), or flexible such as a polyimide. After lamination, circuit patterns are formed in the copper foil by selective etching.

Copper is a material of choice for electronic applications due to high electrical conductivity. One drawback with copper and its alloys is reactivity. The metal reacts with oxygen and tarnishes. The metal is also reactive with some of the chemical solutions encountered during the manufacture of electronic components such as hydrochloric acid and sodium hydroxide. Many anti-tarnish coatings to prevent oxidation of a copper foil prior to lamination are known. These coatings do not also impart improved chemical resistance, particularly after lamination.

Some typical anti-tarnish coatings, all of which are assigned to the same assignee as the present application and all of which are incorporated by reference in their entirety herein, include (1) mixtures of chromic acid and phosphoric acid; (2) sodium dichromate and phosphoric acid; and (3) a co-deposited layer of chromium and zinc.

U.S. Pat. No. 3,837,929 to Caule discloses an aqueous solution containing 3.5 grams per liter (g/l) to saturation of sodium or potassium dichromate mixed with 8–85% phosphoric acid (83–1436 g/l). A foil is immersed in the solution for at least two seconds and then rinsed. Preferably, as disclosed in U.S. Pat. No. 3,764,400, also to Caule, rinsing is in an alkaline solution (PH 8.5–11) at a temperature above 90° C. As further disclosed in U.S. Pat. No. 3,941,627, also to Caule, the treated foil is then laminated to a substrate with an adhesive.

The Caule coating provides the foil with good anti-tarnish resistance. However, the coating is applied prior to lamination and imaging of the foil to form lead traces. A necessary characteristic of the coating is limited acid resistance as disclosed in the '627 patent. The anti-tarnish coating is dissolved in an acid prior to imaging of the foil.

Another coating is disclosed in U.S. Pat. No. 4,647,315 to Parthasarathi which discloses a solution containing 0.02 to 1 g/l chromic acid and 0.02 to 1 g/l phosphoric acid. The solution is used at a temperature of from 60° C. to 90° C. and the foil immersed for 1–120 seconds.

The above coatings are applied non-electrolytically. An electrolytic coating comprising a co-deposited layer of chromium and zinc is disclosed in U.S. Pat. No. 5,022,968 to Lin et al. The substrate is immersed in an aqueous basic solution containing hydroxide ions, from 0.07 g/l to 7 g/l zinc ions and from about 0.1 g/l to 100 g/l of a water soluble hexavalent chromium salt. The concentration of either the zinc ions or the chromium (VI) ions or both, is less than 1.0 g/l. An electric current of from about 1 milliamp per square centimeter to about 1 amp per square centimeter is impressed across the electrolytic cell with the substrate forming the cathode. The electrolytically deposited coating provides an anti-tarnish coating readily removed in both dilute hydrochloric and sulphuric acids.

The above treatments are well suited for protecting a copper or copper alloy substrate prior to photoimaging. It is also desirable to provide an anti-tarnish coating to protect imaged circuit traces laminated to a printed circuit board from oxidation, exposure to chemicals, temperature cycling, and contaminants such as fingerprints, soils and residual chemicals. Unfinished printed circuit boards are frequently stored before being further processed and improved performance is achieved by minimizing tarnish during storage. The printed circuit boards may be multi-layer with a plurality of planar circuit traces separated by dielectric layers. The anti-tarnish coating of the invention enhances adhesion between circuit traces and the dielectric layer.

SUMMARY OF THE INVENTION

Accordingly, it is an object of the invention to provide a method for treating a copper or copper alloy substrate which provides resistance to both tarnish and to chemicals. It is a feature of the invention that the method of treatment includes immersing the substrate in a solution containing both chromium (VI) ions and phosphate ions. Yet another feature of the invention is that further improvement is achieved by selected pretreatment or post treatment steps such as degreasing or rinsing in an aqueous alkali solution.

It is an advantage of the invention that the method of treatment prevents discoloration of laminated circuit traces. Yet another advantage of the invention is that both room temperature and high temperature tarnish resistance is improved. Still another advantage of the invention is that the coating promotes adhesion between copper alloys and polymeric materials. The anti-tarnish coating extends the shelf life of a printed circuit board. Yet another advantage of the invention is that the treatments are not limited to printed circuit boards and can be utilized on leadframes or other electrical or electronic components.

In accordance with the invention, there is provided a method for treating a copper or copper alloy substrate to improve oxidation resistance and chemical resistance. The method includes treating the substrate in an aqueous solution containing from about 0.1 to about 10 g/l of chromium (VI) ions and from about 1.5 to about 10 g/l of phosphate ions.

The objects, features and advantages discussed above will become more apparent from the specification and drawings which follow.

DETAILED DESCRIPTION OF THE INVENTION

Figure 1:
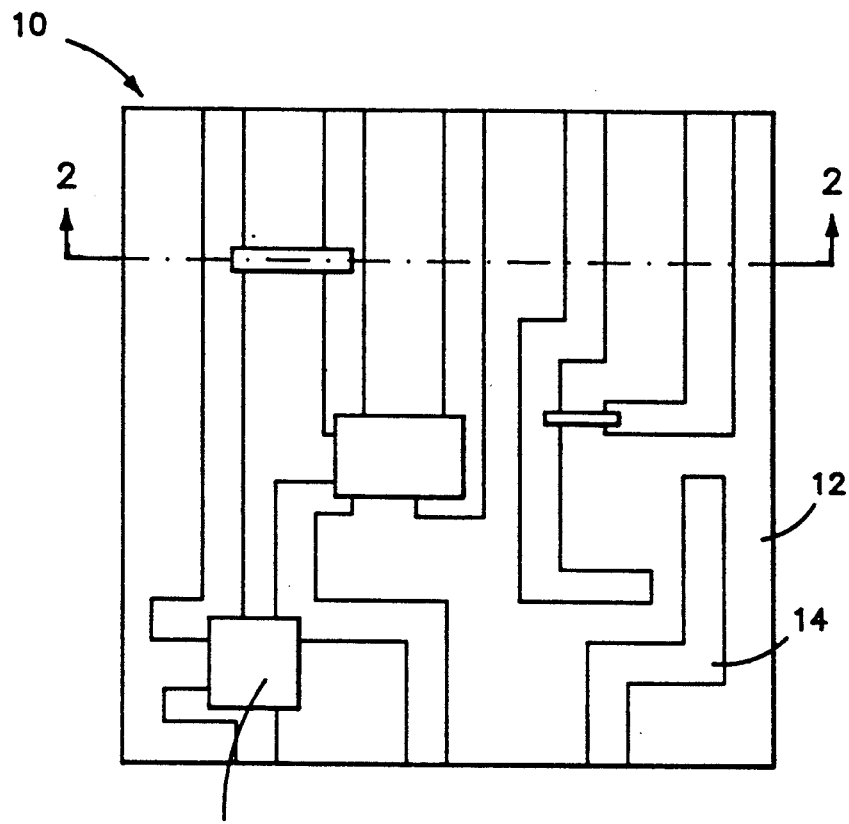
FIG. 1 shows in top planar view a printed circuit board having circuit traces treated according to the method of the invention.

In accordance with the invention, the tarnish and chemical resistance of copper and copper alloy substrates is improved by treating the substrate in an aqueous solution containing water soluble hexavalent chromium ions and phosphate ions. Any method of contacting the substrate with the aqueous solution is acceptable, such as spraying or immersion. Immersion is the preferred method of application. The aqueous solution contains from about 0.1 to about 10 g/l chromium (VI) ions and from about 1.5 to about 10 g/l phosphate ions. It is within the scope of the invention for the solution to contain various additives such as a surfactant or chelating agent. The water soluble hexavalent chromium ions may be provided from any suitable source such as chromic acid, sodium dichromate or potassium dichromate. The most preferred source is sodium dichromate.

The phosphate ions may be provided from phosphoric acid or an acid solution containing a phosphate salt. The latter include a solution of sulfuric acid and sodium, potassium or lithium phosphate. A preferred source of phosphate ions is phosphoric acid. Table 1 illustrates the preferred concentrations of chromium (VI) ions and phosphate ions and the corresponding concentration of the preferred ion contributors (sodium dichromate and phosphoric acid).

TABLE 1

| Compositional Range | Ion Concentration | Preferred ion source Concentration |
| --- | --- | --- |
| BROAD | .1–10 g/l Cr (VI) | .28–28.6 g/l |
|  | 1.5–10 g/l phosphate | 2.9–19.2 g/l |
| INTERMEDIATE | 1.5–5 g/l Cr (VI) | 1.4–14.3 g/l |
|  | 1.5–5 g/l phosphate | 2.9–9.6 g/l |
| NARROW | 0.8–1.5 g/l Cr (VI) | 2.3–4.3 g/l |
|  | 1.8–2.5 phosphate | 3.5–4.8 g/l |

The substrate is immersed in the solution for a time effective to deposit a tarnish and chemically resistant coating. This time ranges from about 2 seconds to about 2 minutes and is dependent on both the copper alloy being treated and the severity of the anticipated environment. For typical electronic circuit or package assembly, an immersion time of from about 10 to 30 seconds is suitable. Any solution temperature from below ambient to boiling may be utilized. Superior chemical resistance is obtained at temperatures above about 50° C. and more preferably, above about 60° C. As the temperature of the aqueous solution is increased, the imparted chemical resistance improves and the etching rate of the substrate by phosphoric acid increases. While slight etching of the substrate is believed beneficial to improve the adhesion between the substrate and a polymer, more severe etching may change circuit trace line width and is to be avoided. Accordingly, at the preferred elevated temperatures, a lower concentration of phosphoric acid is utilized.

The anti-tarnish/chemical resistance properties of the coating are enhanced by pretreatment or post treatment. Degreasing in a suitable solvent improves the effectiveness of the solutions, as does a suitable electroclean. The solvents are preferably of the nonpolar type such as methylene chloride. The substrate is degreased by immersing the substrate in the solvent for a sufficient amount of time such as from about 1 to about 10 seconds. After immersing in the solvent, the substrate is rinsed in deionized water and treated according to the method of the invention.

Effective treatments may also include a post treatment. One suitable post treatment involves rinsing the substrate in deionized water followed by air drying. A preferred post treatment rinse is tap water for a few seconds followed by rinsing in an alkaline solution made from deionized water. One such alkaline solution contains diluted calcium hydroxide at a pH of from about 11 to about 13 and most preferably at about 12. After rinsing in the alkaline solution for a few seconds, the treated substrate is air dried.

The application of the treatments of the invention is seen with reference to the Figures. FIG. 1 shows in top planar view a printed circuit board 10 having a dielectric substrate 12 and a plurality of copper or copper alloy circuit traces 14. The printed circuit board 10 was formed by laminating a layer of copper or copper alloy foil to the substrate 12. The circuit traces 14 were then formed by photoimaging by any means known in the art.

Following lamination of the copper foil and photoimaging of the circuit traces, the foil and/or circuit traces are protected from oxidation and chemical attack by immersing the printed circuit board 10 in the anti-tarnish solution of the invention. The board 10 is then immersed in an aqueous solution containing chromium (VI) ions and phosphate ions. Subsequent to coating, the board is rinsed, preferably in tap water followed by deionized water containing calcium hydroxide. After drying, a thin layer of the anti-tarnish coating coats the circuit traces 14. This layer is believed to be a mixture of chromium, phosporous and oxygen. An immersion time of about 20 to 30 seconds is believed to produce an anti-tarnish layer having a thickness of from about 50 to about 250 angstroms.

Figure 2:
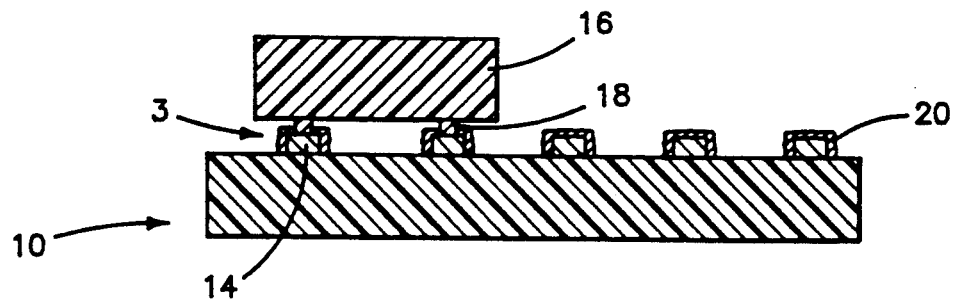
FIG. 2 shows in cross-sectional representation the treated printed circuit board of FIG. 1.

Subsequent to the anti-tarnish treatment, electronic components 16 such as transistors, capacitors and integrated circuit packages are electrically interconnected to the circuit traces 14 such as by soldering. FIG. 2 shows in more detail the interconnection of an electronic component 16 to a printed circuit board 10. Electronic component 16 has leads 18 which are either flush against circuit traces 14 such as a "J-lead" or "gull lead" on a surface mount package or extend into an aperture formed in the circuit trace. The lead is then soldered to circuit trace 14 using a conventional solder, typically an alloy of lead and tin or of gold and tin. A preferred solder is a lead/tin alloy with a melting temperature of about 250° C.

Figure 3:
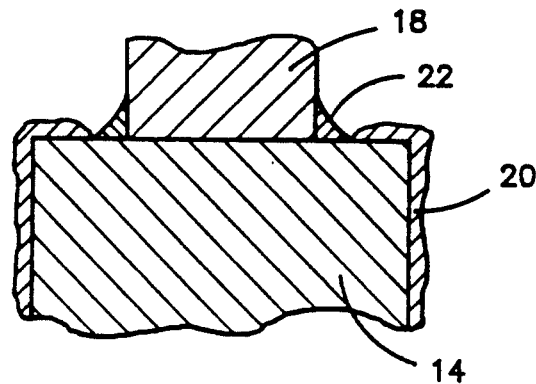
FIG. 3 shows in cross-sectional representation a detailed view of a solder joint.

The solder joint is more clearly seen in FIG. 3 which is an exploded view of the portion of FIG. 2 indicated by reference numeral 3. The lead 18 makes physical contact with circuit trace 14. An anti-tarnish coating 20 originally coated both the top of the lead and the sides of the leads. One advantage of the anti-tarnish coating of the invention over organic coatings such as benzotriazole, is a uniform coating 20 forms along the sides of the leads. This coating prevents undercutting of the circuit trace 14 by exposure to dilute acids.

The solder 22 may be capable of wetting and bonding to the anti-tarnish layer 20. If an inferior bond is formed, the coating 20 may be removed from the bonding surface of the circuit trace 14 as illustrated in FIG. 3. Suitable methods to remove the tarnish coating include combining the solder with an active flux such as a mildly to fully active rosin flux.

Alternatively, the bonding areas of the circuit traces 14 may be masked prior to the anti-tarnish treatment such that a coating is not applied to the solder areas of the circuit traces. Another alternative is to remove the anti-tarnish coating 20 from the solder areas such as by mechanical abrasion or chemical dissolution.

Figure 4:
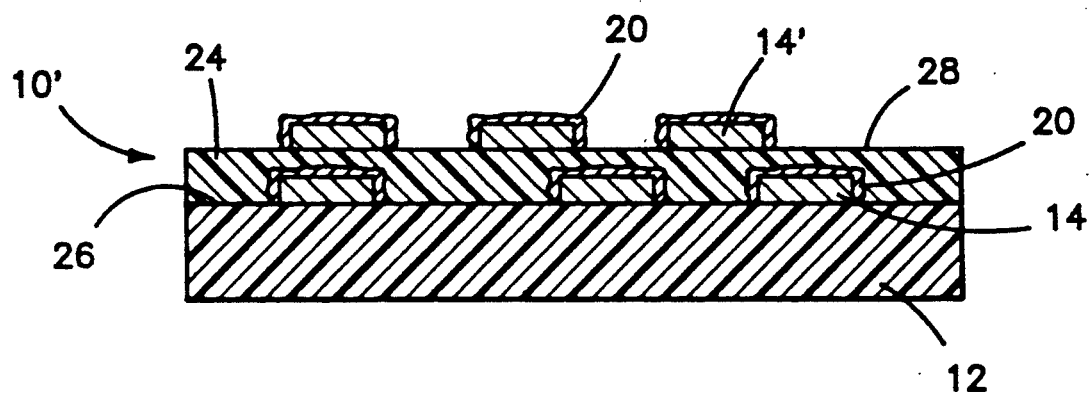
FIG. 4 shows in cross-sectional representation a multi-layer circuit board treated according to the method of the invention.
Figure 5:
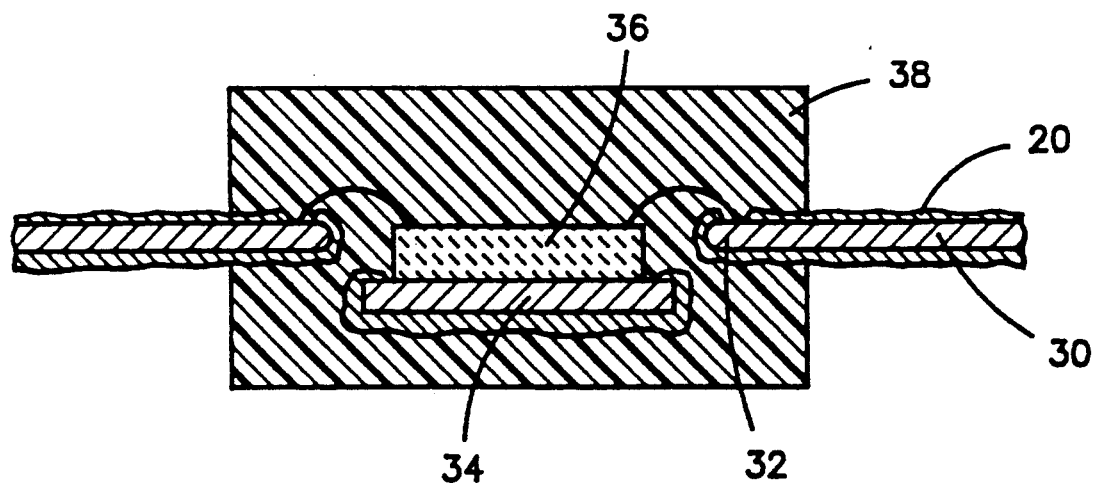
FIG. 5 shows in cross-sectional representation a plastic electronic package having a leadframe treated according to the method of the invention.

The anti-tarnish coating prevents the formation of copper oxides on the circuit traces. Applicants believe improved adhesion to a polymer results. Multi-layer circuits as illustrated in FIG. 4 and electronic packages as illustrated in FIG. 5 are also improved by the treatment of the invention. With reference to FIG. 4, a multi-layer printed circuit board 10' has a first dielectric substrate 12 to which are laminated a first set of circuit traces 14. The first set of circuit traces 14 are coated with the anti-tarnish coating 20 of the invention. A second dielectric layer 24 is then bonded to a face 26 of the first dielectric 12. The anti-tarnish coating 20 ensures that the second dielectric 24 is bonded to a metal rather than copper oxide which could flake from the circuit trace 14, leading to delamination. Additionally, copper catalyzes the degradation of polymers. The coating 20 forms a barrier preventing exposure of the second dielectric 24 to the copper of the circuit trace 14. A second copper or copper alloy substrate is then bonded to a surface 28 of the second dielectric 24. The second layer of metallic foil is then etched by photolithography into a desired pattern of second circuit traces 14' separated and electrically isolated from the first set of circuit traces 14 by the second dielectric 24. The second set of circuit traces 14' may also be protected from tarnish and chemical attack by the anti-tarnish coating 20 of the invention.

FIG. 5 shows yet another application of the treatment of the invention. Rather than treating a copper foil, a copper leadframe 30 is coated with the anti-tarnish coating 20 of the invention. Leadframes are typically made from copper or a copper alloy to maximize electrical conductivity and have a thickness of from about 0.13 to about 5.1 mm. The leadframe 30 has a plurality of leads terminating at inner lead ends 32 defining a central aperture. Frequently, a die paddle is located in the aperture for attachment of an integrated circuit device 36. The die paddle 34 is also preferably coated with the anti-tarnish coating 20. The coating 20 improves the adhesion of the leads and die attach paddle 34 to a molding resin 38. Improved adhesion minimizes the ingress of water along the leads and the accumulation of moisture under the die attach paddle 34. Preventing the accumulation of moisture under the die attach paddle 34 is desirable to prevent the "popcorn effect". When the package is heated such as during soldering, the moisture under die attach paddle expands, forming a bulge in the base of the package. Improved adhesion between the leads and the die attach paddle and the molding resin 38 minimizes or prevents the popcorn affect.

While the coated leadframe is particularly suited for plastic encapsulated electronic packages, metal packages such as disclosed in U.S. Pat. No. 4,939,316 to Mahulikar et al. which is incorporated herein in its entirety, are also benefited. This type of metal package has discrete base and cover components. A leadframe is disposed between the components and adhesively bonded to both. The coatings of the present invention would be expected to improve the adhesive bond to the leadframe. Additionally, the various package components could be similarly treated to achieve improved adhesion.

EXAMPLES

The resistance to tarnish and chemicals provided by the treatment of the invention is illustrated in Table 2. This data was generated by immersing copper alloy C110 (ectrolytic tough pitch copper having a nominal composition by weight of 99.90% minimum copper and a maximum oxygen content of 0.5%) alloy foil in a aqueous solution containing $Na_2Cr_2O_7.2H_2O$ and $H_3PO_4$ in the specified concentrations. The foil was immersed for 20 seconds, rinsed with tap water for a few seconds and then rinsed in deionized water containing $Ca(OH)_2$ at a pH of 12 and air dried.

Bake resistance was determined by heating the samples for 30 minutes in air to the specified temperatures and visually comparing to a control sample which was not heated. A rating of 1 indicates that the bake sample appears essentially the same as the control. Higher rating numbers indicating progressively more oxidation and tarnish.

Chemical resistance was evaluated by immersing the sample in the specified acid or alkali solution for 30 seconds. The test coupons were then immersed in ammonium sulfide $(NH_4)_2S$. The appearance of blue spots indicated attack of the copper alloy substrate. A rating of 1 indicated the appearance of virtually no blue spots. Higher numbers indicated progressively more blue spotting, indicative of a less satisfactory coating.

TABLE 2

Comparison of Different Anti-tarnish Treatments

| Treatment | $Na_2Cr_2O_7.2H_2O$ (g/l) | $H_3PO_4$ (g/l) | Process Temp (°C.) | Bake Resistance (30 min) 170° C. | 190° C. | 210° C. | Chemical Resistance (30 min) 0.12N HCl | 0.24N HCl | 3N NaOH |
|---|---|---|---|---|---|---|---|---|---|
| 1 | 34 | 574 | Ambient | 1 | 1 | 1 | 5 | 5 | 1 |
| 2 | 1 | 2 | Ambient | 1 | 3 | 3 | 5 | 5 | 3 |
| 3 | 1 | 2 | 50 | 1 | 1 | 1 | 1-2 | 2-3 | 1 |
| 4 | 1 | 2 | 60 | 1 | — | 1 | — | 1 | 1 |
| 5 | 3-4 | 29 | Ambient | 1 | 1 | 1 | 5 | 5 | 1 |
| 6 . | 7 | 29 | Ambient | 1 | 1 | 3 | 3 | 4 | 1 |
| 7 | 3 | 8 | 60 | 1 | 1 | 1 | 1 | 1 | 1 |
| None | — | — | — | 5 | — | — | 5 | — | 5 |
| Reference I | 0.3 g/l $CrO_3$ | 0.6 | 57 | 1 | 3-5 | — | 2 | 3-4 | 1 |

TABLE 2-continued

| Comparison of Different Anti-tarnish Treatments | | | | | | | | | |
|---|---|---|---|---|---|---|---|---|---|
| Treatment | $Na_2Cr_2O_7 \cdot 2H_2O$ (g/l) | $H_3PO_4$ (g/l) | Process Temp (°C.) | Bake Resistance (30 min) | | | Chemical Resistance (30 min) | | |
| | | | | 170° C. | 190° C. | 210° C. | 0.12N HCl | 0.24N HCl | 3N NaOH |
| Reference II | 34 | 574 | Ambient | 3 | 5 | — | 4 | 4–5 | 1 |

*Treatments 1–7 and reference 1 includes solvent pre-treat and alkaline post rinse.
Reference 2 has only the post treatment.

The patents cited in this application are intended to be incorporated herein by reference It is apparent that there has been provided in accordance with this invention a treatment for copper or copper alloy substrates which imparts improved oxidation and chemical resistance and fully satisfies the objects, means and advantages set forth herein before. While the invention has been described in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A method of treating a copper or copper alloy substrate to provide improved oxidation resistance and chemical resistance, comprising:

treating said substrate with an aqueous solution containing from about 0.1 to about 10 g/l of chromium (VI) ions and from about 1.5 to about 10 g/l of phosphate ions, said phosphate ions being provided from a source selected from the group consisting of phosphoric acid, a mixture of sulfuric acid and sodium phosphate, a mixture of sulfuric acid and potassium phosphate, and a mixture of sulfuric acid and lithium phosphate.

2. The method of claim 1 wherein said method of treating comprises immersion of said substrate into said aqueous solution.

3. The method of claim 2 wherein the aqueous solution contains from about 1.5 to about 5 g/l chromium (VI) ions and from about 1.5 to about 5 g/l phosphate ions.

4. The method of claim 3 wherein said chromium (VI) ions are provided from a source selected from the group consisting of chromic acid, sodium dichromate and potassium dichromate.

5. The method of claim 4 wherein said chromium (VI) ions are provided from sodium dichromate.

6. The method of claim 4 wherein said phosphate ions are provided from phosphoric acid.

7. A method for the manufacture of a printed circuit board having improved resistance to oxidation and chemical attach, comprising the sequential steps of:

(a) laminating a copper or copper alloy foil to a first dielectric substrate;

(b) forming said foil into a plurality of circuit traces; and (c) coating both said dielectric substrate and said plurality of circuit traces with a layer containing chromium, phosphorous and oxygen by immersing said substrate and said plurality of circuit traces in an aqueous solution containing from about 1.4 to about 14.3 g/l sodium dichromate and from about 2.9 to about 9.6 g/l phosphoric acid, said aqueous solution being heated to a temperature of from about 50° C. boiling.

8. The method of claim 7 wherein said aqueous solution contains from about 2.3 to about 4.3 g/l sodium dichromate and from about 3.5 to about 4.8 g/l phosphoric acid.

9. The method of claim 7 wherein subsequent to step (c), a second dielectric layer is bonded to said first dielectric layer and to said plurality of circuit traces.

10. A method for forming an electronic package having reduced moisture ingress comprising immersing a leadframe in an aqueous solution containing from about 1.4 to about 14.3 g/l sodium dichromate and from about 2.9 to about 9.6 g/l phosphoric acid, said aqueous solution being heated to a temperature of from about 50° C. to boiling, said immersion taking place prior to sealing said leadframe to said package.

11. The method of claim 10 wherein said aqueous solution contains from about 2.3 to about 4.3 g/l sodium dichromate and from about 3.5 to about 4.8 g/l phosphoric acid.

12. The method of claim 10 wherein a portion of said leadframe is embedded in a molding resin.

13. The method of claim 10 wherein a portion of said leadframe is disposed between an adhesively bonded to discrete base and cover components.

14. The method of claim 13 wherein said base and cover components are also treated with said aqueous solution.

* * * * *